(12) United States Patent
Bogese

(10) Patent No.: US 7,223,128 B1
(45) Date of Patent: May 29, 2007

(54) SURFACE MOUNT MODULAR JACK

(75) Inventor: Stephen B. Bogese, Salem, VA (US)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/236,920

(22) Filed: Jan. 25, 1999

(51) Int. Cl.
*H01R 24/00* (2006.01)

(52) U.S. Cl. ......................... 439/676; 439/83
(58) Field of Classification Search ............... 439/83, 439/676, 876, 344
See application file for complete search history.

(56) References Cited

U.S. PATENT DOCUMENTS

| | | | | |
|---|---|---|---|---|
| 4,629,266 | A | * 12/1986 | Viselli | 439/676 |
| 4,688,875 | A | * 8/1987 | O'Connor | 439/81 |
| 4,875,863 | A | * 10/1989 | Reed | 439/83 |
| 4,992,052 | A | 2/1991 | Verhoeven | 439/62 |
| 5,244,412 | A | 9/1993 | Hatch et al. | |
| 5,364,294 | A | * 11/1994 | Hatch et al. | 439/83 |
| 5,413,491 | A | 5/1995 | Noschese | 439/108 |
| 5,478,261 | A | 12/1995 | Bogese, II | 439/676 |
| 5,538,448 | A | * 7/1996 | Tsao | 439/83 |

FOREIGN PATENT DOCUMENTS

EP 0337632 A1 10/1989

* cited by examiner

*Primary Examiner*—Hae Moon Hyeon
(74) *Attorney, Agent, or Firm*—Hoffmann & Baron, LLP

(57) ABSTRACT

An improved modular telephone-style jack featuring a guidance system positioned on the lower outer wall so that the guidance system maintains the position of the surface mount solder tails of the contacts of the jack in a controlled fashion. The guidance system consists of a series of substantially linear, parallel ridges which extend outward from the outer wall so that the peak of each ridge is in contact with or immediately adjacent the upper surface of a printed circuit board. The peak of each ridge extends along the upper surface of the printed circuit board for a length that is greater than the length of the solder tail to provide alignment of each solder tail with its corresponding solder paste connection area. Each ridge prevents any solder tail from pivoting such that it could accidentally make contact with either neighboring solder tail. Each ridge further prevents the distance separating neighboring contacts from being reduced to such a small distance that solder could bridge across both contacts. This substantially reduces the risk of an electrical short between two separate signal paths which would render the soldered board unusable with a resultant high scrap cost with the loss of all soldered components. The peak of each ridge further serves to prevent migration and wicking of the solder paste for two separate circuits from joining to each other, thereby shorting the electrical connection between the two separate signal paths. This condition would also render the board unusable. The combination of features of the guidance system allows the solder tails to be formed so that no portion of the solder tail extends beyond the rear wall of the jack. This reverse gull wing configuration of the solder tail provides significant protection of the solder tails as a result of being located entirely under the lower wall of the jack so that the solder tails are not exposed to bending or twisting as normally occurs with j type or gull wing type solder tails or with other solder tail types which extend beyond the main rear wall of the jack.

7 Claims, 5 Drawing Sheets

SURFACE MOUNT MODULAR JACK

BACKGROUND OF THE INVENTION

1. Field of the Invention

This invention relates to electrical connectors and, more particularly, is directed toward a surface mount modular telephone-style jack which has protected, automatically aligned solder tails.

2. Description of Related Art

Telephone-style modular jacks are widely used in the computer networking and communications industries for interconnection of computers, modems, printers, and similar electronic equipment.

The demand for smaller packaging and more automated manufacturing has required the industry to increasingly use more surface mount components and the associated higher temperature board soldering processes in order to reduce the cost of an assembled printed circuit board and to improve the yield of electrically good circuit boards.

Two manufacturing processes which are increasingly used are IR and vapor phase soldering. In both processes, a metallic mask is used which contains cutouts of various shapes and sizes so that a paste of solder can be silk screened onto the circuit board surface. The cutouts correspond to locations of interconnections, either to solder tails of surface mount components or connectors or to metallic traces which form the electrical paths within a multi-layer circuit board. During the soldering process, the temperature of the chamber that the circuit boards pass through is of a sufficiently high temperature so that the solder paste on the board is increased to liquefy the solder. This allows the solder to wick onto any metallic surface in contact with the solder paste, forming an electrical connection which is typically referred to as a solder filet.

The IR soldering process uses radiant heat to heat both the surface mount components as well as the solder paste so that the solder tails are heated to a specific high temperature such that the liquefied solder is drawn to the solder tails, a process called wicking. The vapor phase soldering process heats a gaseous material which transfers the heat to each component as well as the solder paste, liquefying the solder paste in a similar manner to that described for IR soldering. As the circuit board passes from the highest temperature reflow chamber to a lower temperature, the solder solidifies. This produces solder filets.

Surface mount connectors typically use one of several configurations of solder tails to provide a means of forming an electrical connection from the printed circuit board to the contacts of the connector. One configuration is called a "J" tail, in which the solderable end of the contact is formed into the shape of the letter J. The curved bottom of the J is positioned such that the lowest point of the curved bottom is below the upper surface of the circuit board when the connector is fully seated on the circuit board. This would normally mean that the connector could not mount and grip the circuit board as the lowest solder tail point would meet and engage against the upper surface of the board, preventing the connector from being seated against the circuit board. However, the free end of the curve is not restrained, thereby allowing the curved surface to flex when engaging a rigid surface. By this flexing capability, the curve of the J, once the connector has been seated to the board, applies a force against the solder paste which resides on the surface of the circuit board. This applied force causes the curve of the J to press down against the circuit board and thereby remain fully within the solder paste, so that when the solder of the paste liquefies and wicks onto the solder tail, the lower part of the curve is surrounded by solder to produce a gas-tight solder joint. This is necessary to make a reliable electrical connection between the contact solder tail and the metal circuit of the circuit board. The gull wing is another widely used configuration for a solder tail of an electrical contact within a component. The gull wing has the approximate shape of the letter "L", in which the foot of the L extends away from the component body. The foot may optionally angle slightly downward to make contact with the solder paste on the printed circuit board surface.

The gull wing style of solder tail is a rigid shape which does not flex, so that the foot resides in the solder paste due to the effect of surface tension, which keeps the foot in its position relatively constant to the paste. This style of solder tail is used primarily for integrated circuits (IC's) because they have low weight. The low weight of IC's allows the solder paste to exert a substantial hold on the component to retain the alignment of the gull wing's foot in alignment with the corresponding solder paste trace on the printed circuit board, which results in the solder wicking around the foot of the gull wing to produce a gas-tight connection to each solder tail.

One newer solder tail design is a variation of the gull wing to attempt to overcome the difficulties of the prior art solder tails when used with connectors. This newer solder tail can be described as a sweeping "L" because of its shape and its profile which resembles a sweep elbow. The vertical portion of the L is reduced in length so that this portion is shorter than the sweep and the foot taken together. The sweep typically has a contained angle greater than ninety degrees so that the foot of the solder tail angles down toward the printed circuit board. As the sweep is curved in its shape, it has an inherent spring quality so that it can maintain the foot in constant engagement with the solder paste on the printed circuit board. Because of the spring properties, the foot is held in the solder paste so that during solder reflow, the solder flows around the tip of the foot and forms a gas-tight connection to the solder tail foot.

This design, while providing an improvement over prior art designs, still has two major deficiencies of previous solder tail designs. In all prior art designs, a portion of the solder tail extends beyond the rear wall of the connector. This extended portion is beyond the protective boundary of the connector housing, and is exposed to possible mechanical damage or alteration of alignment from its original alignment. Damage or misalignment could occur during packaging of the connectors, or during stacking or handling during shipment or warehousing, during removal of the connectors from their packaging containers, or during pickup and handling by automated pick and place equipment.

Due to the close spacing of components and the density of connections on surface mount printed circuit boards, alignment of solder tails to solder paste is critical and has very low margin for error. Even a slight misalignment of the solder tails can easily result in a high resistance, incomplete connection, or a failed, non-electrical connection, or in a bridged connection between two adjacent solder tails from solder that bridges over to both tails. The fully assembled printed circuit board that is produced is now defective because of the connector and it must be scrapped.

Another deficiency is the absence of a means of controlling the alignment of the solder tails to maintain a high degree of alignment accuracy. The yield of defect free printed circuit boards is in direct proportion to the relative alignment of a solder tail to its corresponding solder paste pattern on the printed circuit board. As previously described, the density of traces on the printed circuit board is becoming greater with less clearance space between each such trace and therefore less tolerance is available for aligning a solder tail.

Various approaches have been used to try and overcome these deficiencies in the designs of surface mount connectors, such as is taught in the following patents: U.S. Pat. Nos. 4,992,052 and 5,413,491, the disclosure of which are specifically incorporated herein by reference. U.S. Pat. No. 5,413,491 contains two rows of contacts, in which each contact is comprised of a mating portion designed to engage a square post mateable, and a solder tail portion in the configuration of a gull wing. The foot of each gull wing portion is angled slightly downward to engage into the solder paste and against the surface of the printed circuit board when the connector is fully seated against the printed circuit board. The foot of each gull wing projects out beyond the side wall of the connector body that retains the contact so that the free end of the foot is exposed to external damage.

A primary objective of U.S. Pat. No. 4,992,052 is to provide an improved gull wing type of contact which utilizes an angled transition portion from the start of the foot of the "L" to a point more than half the length of the foot. The solder portion of the foot is less than the angled portion and is aligned at an angle from the angled portion such that the solder portion is substantially parallel to the surface of the printed circuit board. The angled transition portion provides spring pressure engagement through the solder portion by holding the solder portion against the surface of the printed circuit board and within the solder paste.

While the recent prior art makes some improvements toward addressing the problem of providing precise alignment of each solder tail to the solder paste pattern that corresponds to each solder tail, and provides for some additional spring engagement of each solder tail to its corresponding solder paste area, it remains deficient in providing the high precision of alignment of the solder tail to its corresponding solder paste, and in protecting the solder tails from possible alignment or mechanical damage.

OBJECTS AND SUMMARY OF THE PRESENT INVENTION

A primary object of the present invention is to provide a surface mount modular female jack with an alignment structure that provides control of the solder tails of the contacts contained within the modular jack to overcome the alignment deficiencies of the prior art.

Another object of the present invention is to provide a means for precisely positioning the solder tails of the contacts of the modular jack so that the solder tails can be accurately placed in co-alignment with the solder paste patterns.

A further object of the present invention is to provide a female modular jack that provides for the solder tails to be held in spring engagement against the surface of the printed circuit board and in the solder paste pattern on the surface of the circuit board.

Yet another object of the present invention is to provide a means for protecting the solder tails of the contacts in the female jack from accidental damage or misalignment as a result of exposure to various conditions during handling or shipping.

The foregoing and other objects and features are achieved in accordance with one aspect of the present invention by means of a substantially parallel series of "v" shaped ribs which extend downward from the lower outer wall of a modular female jack. A series of contacts are contained within the female jack in which the contacts consist of a mating portion, a solder tail portion, and an intermediate portion which connects to the mating portion at one end and to the solder tail portion at the other end. The modular jack has an opening in one wall of a size and shape to accept a male modular plug. The mating portion of the contact in the jack can be of various shapes, each of which allows the mating portion to deflect from its original position in the opening to a new position when it engages and is mated to the contact blades of a modular plug. The solder tail portion is designed to engage the surface of the printed circuit board such that the solder tail is partly enveloped by solder paste which has been screened onto the surface of the circuit board. A recessed channel is formed between each set of adjacent v ribs such that each solder tail can be located in a single channel between each set of adjacent ribs. The solder tail is formed into a reverse gull wing shape such that the solder tail foot is located in each channel and is positioned below the lower outer wall of the jack.

In accordance with another aspect of the present invention, the solder tail foot is angled slightly downward so that upon insertion of the jack into the circuit board and when the jack is fully seated on the surface of the circuit board, the solder tail foot is deflected from its free state position. In the deflected position, the solder tail foot exerts force against the surface of the circuit board, and remains in a relatively fixed position to the solder paste pattern on the surface of the circuit board. This results in solder paste partly enveloping the solder tail foot to flow around the foot during solder reflow to produce a high quality gas-tight solder joint.

In accordance with yet another aspect of the present invention, the v ribs are spaced apart such that the width of the channel formed between said ribs is similar in width to the width of the solder tail. The close fit of the foot of the solder tail to the channel between said ribs provides a high degree of angular control of each contact relative to its preferred parallel position, resulting in substantially greater co-alignment of the solder tail foot to its respective solder paste pattern. This produces a soldered joint that has more area of the foot enclosed within the solder filet to produce a larger and stronger gas-tight solder joint.

In accordance with a further aspect of the present invention, the v ribs extend downward a distance such that the peak of each v rib is substantially co-planar with the outer surface of the lower wall of the jack. This results in the peak of each v rib being directly in contact with the surface of the circuit board when the jack is fully seated and engaged to the circuit board. The contact of the peak of each v rib to the board surface provides a physical barrier to liquefied solder flowing from its pattern area to an adjacent pattern area, thus preventing an electrical short and the resultant defective circuit board.

DETAILED DESCRIPTION OF THE PREFERRED EMBODIMENTS

The contact has a mating portion which, in a mated condition, acts as a spring and exerts force so as to attempt to return to its original free state. The mating portion of the female contacts are parallel to each other and are spaced apart to match the corresponding spacing between the contact blades of the modular plug to provide alignment of the respective corresponding female and male contacts. The contact is comprised of a material that has an inherent spring characteristic when deflected from an at rest position. This property, in combination with specific design shapes, results in sufficiently high forces so that the mated pair of female to male contact forms a gas-tight connection. The contact has a solder tail portion such that the solder tail portion is at the opposite end of the contact from the mating portion. The solder tail portion is comprised of a leg and a foot such that the leg and foot together form an "L" shape in which the foot corresponds to the foot of the L and the leg corresponds to the vertical part of the L. The foot is angled downward from the leg so that the free end of the foot is lower than the joint of the foot to the leg of the L. The foot of the solder tail, upon seating of the connector onto the printed circuit board, is deflected when engaging the surface of the circuit board, resulting in the foot becoming substantially perpendicular to the leg. The spring like properties of the contact material provide for the foot to apply continuing force against the surface of the circuit board so that the foot maintains its position relative to a location on the circuit board. The engagement of the foot holds the foot in the correct location in the solder paste such that the resulting solder joint is gas-tight and forms a reliable connection.

Figure 1:
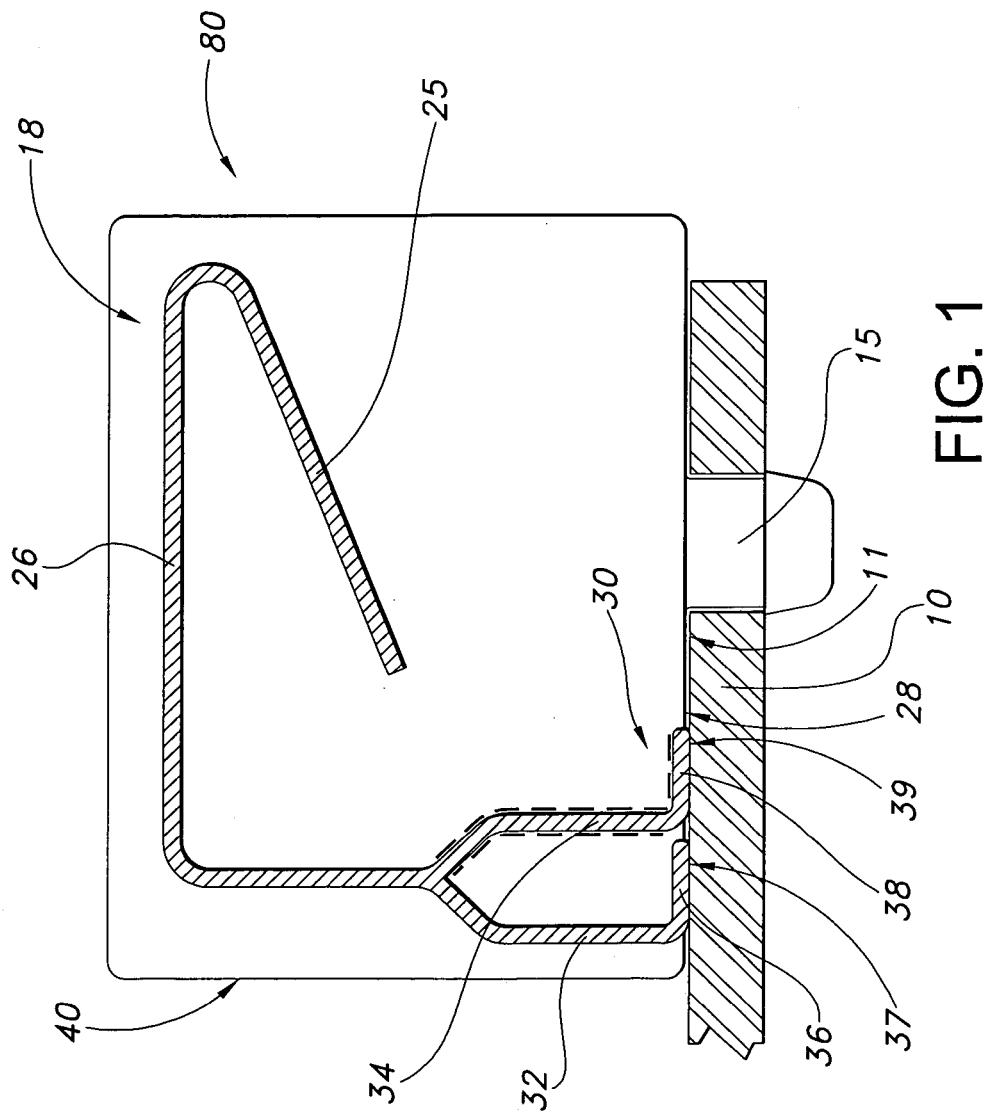
FIG. 1 is a side sectional view of a modular female jack featuring one type of a contact mating shape

Referring now to the drawings, wherein like reference numerals indicate identical or corresponding parts throughout the several views; more particularly, in FIG. 1, a preferred embodiment of the present invention is indicated generally by reference numeral 80.

The contact mating portion 25 of contacts 18 of modular jack 80 are shown in their free state in which they are not mated with the corresponding male contact blades of a modular male plug. The free end of mating portion 25 is designed to flex at the "U" intersection between the mating portion 25 and the contact intermediate portion 26. The free end of mating portion 25 is lifted during engagement with the corresponding contact blade toward the intermediate portion 26. The connector 80 has two mounting means 15 located on the lower wall of the connector. Each mounting means 15 is comprised of two opposing halves designed to flex toward each other so that during insertion of the mounting means into the circuit board, the two halves compress together to fit through an opening which is smaller than the distance across the two foot halves. After the lower wall 28 of the connector 80 seats against the surface of the circuit board, the halves flex back to their at rest position, locking the connector to the circuit board 10. The solder tail foot 36 and foot 38 are deflected as the connector is being seated against surface 11 of the circuit board 10, and as the connector is fully seated, feet 36 and 38 deflect to a perpendicular orientation to the respective legs 32 and 34.

Figure 3:
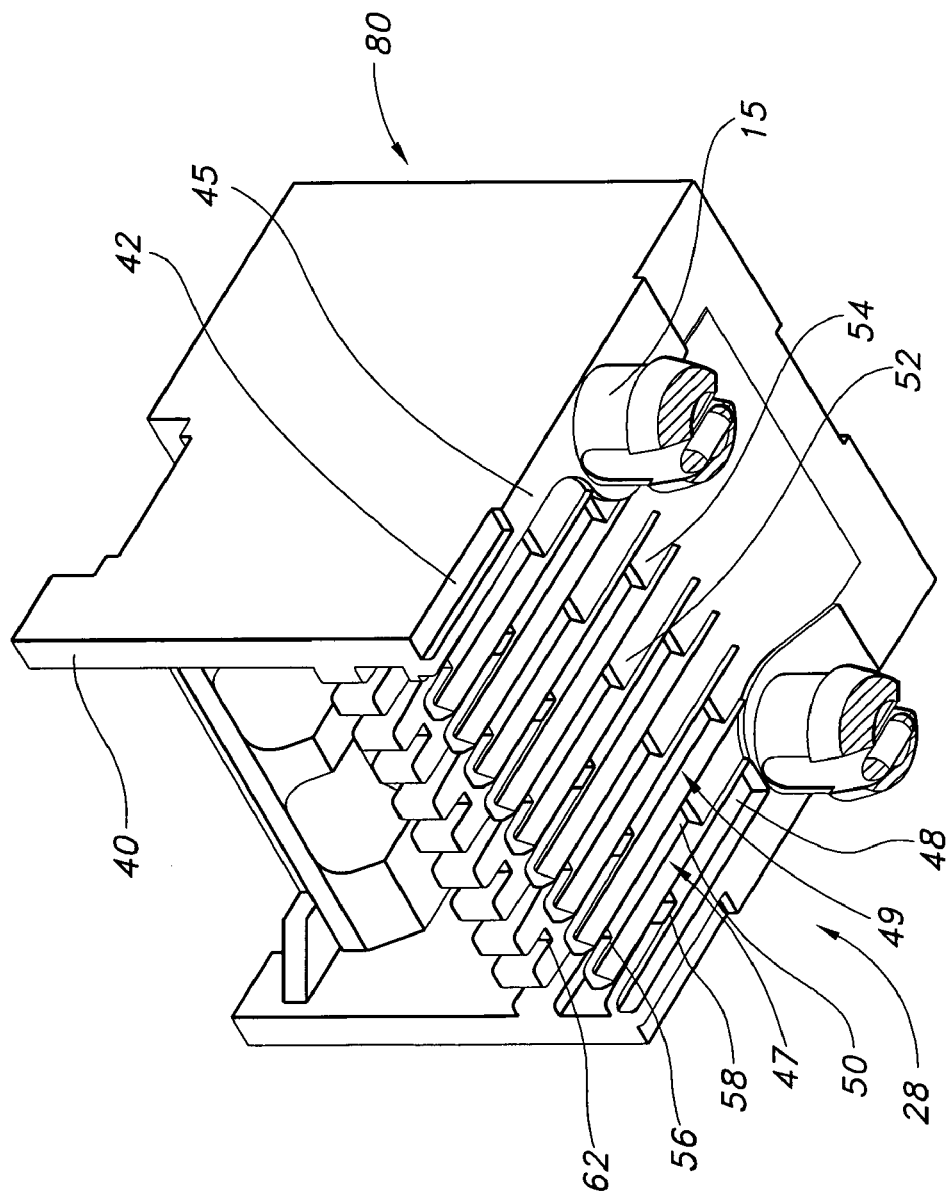
FIG. 3 is a perspective view of a modular female jack viewed from under and from the rear of the jack prior to assembly of the contacts into the jack

Feet 36 and 38 exert a force against surface 11 of circuit board 10 produced by spring tension as a result of deflecting feet 36 and 38 from their at rest state. Free end 37 of foot 36, in its deflected state, is contained between a pair of V ribs 47 and 49 as shown in FIG. 3. The spring tension of each foot 36 and 38 maintains each foot in a fixed position on surface 11 of the circuit board 10. Surface 11 of the circuit board is covered in a pattern with solder paste designed for reflow by IR or vapor phase soldering processes. The pattern of solder paste on the surface of a circuit board is produced by overlaying surface 11 with a metal mask having cutouts in the mask that correspond to the pattern of solder paste desired on the surface of a circuit board. Using a process similar to silk screening, a ribbon of solder paste is wiped across the metal mask by a flexible blade which fills in each cutout with solder paste. After the solder paste has been wiped across the metal mask, the circuit board is lowered away from the metal mask, leaving the pattern of solder paste on the circuit board. The pattern of solder paste results in solder paste being positioned on the surface of a circuit board such that the solder paste can be liquefied while maintaining physical contact with component or connector solder tails and maintaining physical contact with the exposed metallic traces which are integral within the printed circuit board. Maintaining physical contact with both the solder tail and the corresponding trace of the circuit board is critical to provide that the solder, during its liquefaction and subsequent solidification, will envelop and produce a gas-tight solder filet between each corresponding solder tail and metallic trace. This requires precision alignment between the trace of the board, the solder paste pattern, and the solder tail of the component or connector. Misalignment of the solder tail to the solder paste pattern can result in a poor electrical connection between the solder tail and the metallic trace through the solder filet.

Figure 2:
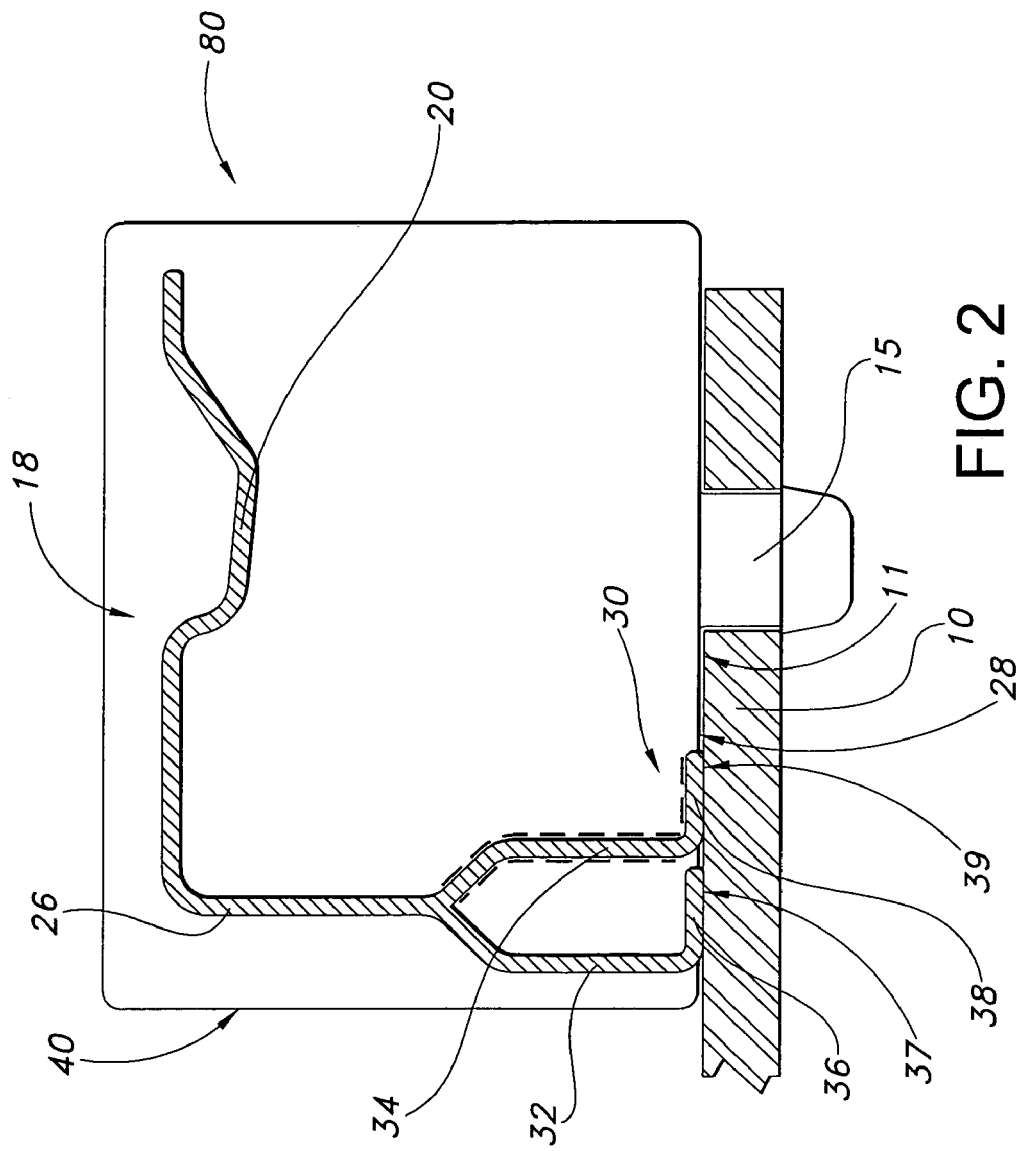
FIG. 2 is a side sectional view of a modular female jack featuring an alternate type of a contact mating shape

An alternate embodiment of modular jack 80 is shown in FIG. 2, in which contact mating portion 20 of contact 18 is shown in its at rest state prior to mating with a contact blade of a modular male plug. Contact 18 utilizes a contact design disclosed in U.S. Pat. No. 5,478,261 in which contact mating portion 20 comprises a lower linear beam such that the lower surface of lower linear beam is lifted from its at rest state during coupling of a male plug. Contact mating portion 20 is deflected upward toward the upper wall of connector 80 in which the lower surface of the lower linear beam exerts a force against the upper surface of a corresponding contact blade of a male plug. Each contact 18 is also comprised of a solder tail portion in which adjacent side by side contacts are arranged so as to produce an alternating, staggered arrangement of solder tail portions. This alternating, staggered arrangement is shown with adjacent solder tail portions 36 and 38. As described previously, each solder tail portion is substantially reverse "L" shaped in which the legs 32 and 34 are substantially vertical and the feet 36 and 38 extend toward and under the connector body. Free ends 37 and 39 of respective solder feet 36 and 38 are shown in their fully deflected positions as a result of jack 80 being fully seated on circuit board 10. This produces the same spring engagement for solder feet 36 and 38 to the solder paste pattern as described for FIG. 1.

Referring now to FIG. 3, lower wall 28 of connector 80 contains a series of ridges having a shape of a "V" and such that each rib is substantially linear. The wide top of the V is joined with floor 28 of connector 80 to provide strength and precise positioning of the V from floor 45. Peak 58 of rib 47 has a height such that peak 58 is co-planar with lower wall surface 45, which is the surface that seats against upper surface 11 of circuit board 10. Surface 45 surrounds each of the two mounting means 15 to provide a seating surface for said halves of mounting means 15 to lock circuit board 10 between gripping edges of mounting means 15 and seating surface 45. With connector 80 fully seated on printed circuit board 10, upper circuit board surface 11 is substantially co-planar with seating surface 45 of connector 80. To provide for complete separation of adjacent solder tail feet 36 and 38, peaks 56 and 58 must be in close proximity to upper circuit board surface 11, and peaks 56 and 58 may optionally touch upper board surface 11 to provide a total closure between adjacent ribs 47 and 49. Ribs 47 and 49 extend from the rear wall 40 of connector 80 forward toward the front face of connector 80, and are substantially parallel to each other in a side by side arrangement. Channels are formed between each adjacent set of ribs, such as channel 50 formed between ribs 47 and 49. Said channels formed between ribs are recessed such that the depth of the recess is not less than the thickness of solder tail foot 36 or 38. This depth of channel provides for fully containing solder tail feet 36 and 38 in which the solder tail feet can deflect to a new position resting against upper circuit board surface 11 when connector 80 is fully seated on circuit board 10.

Figure 4:
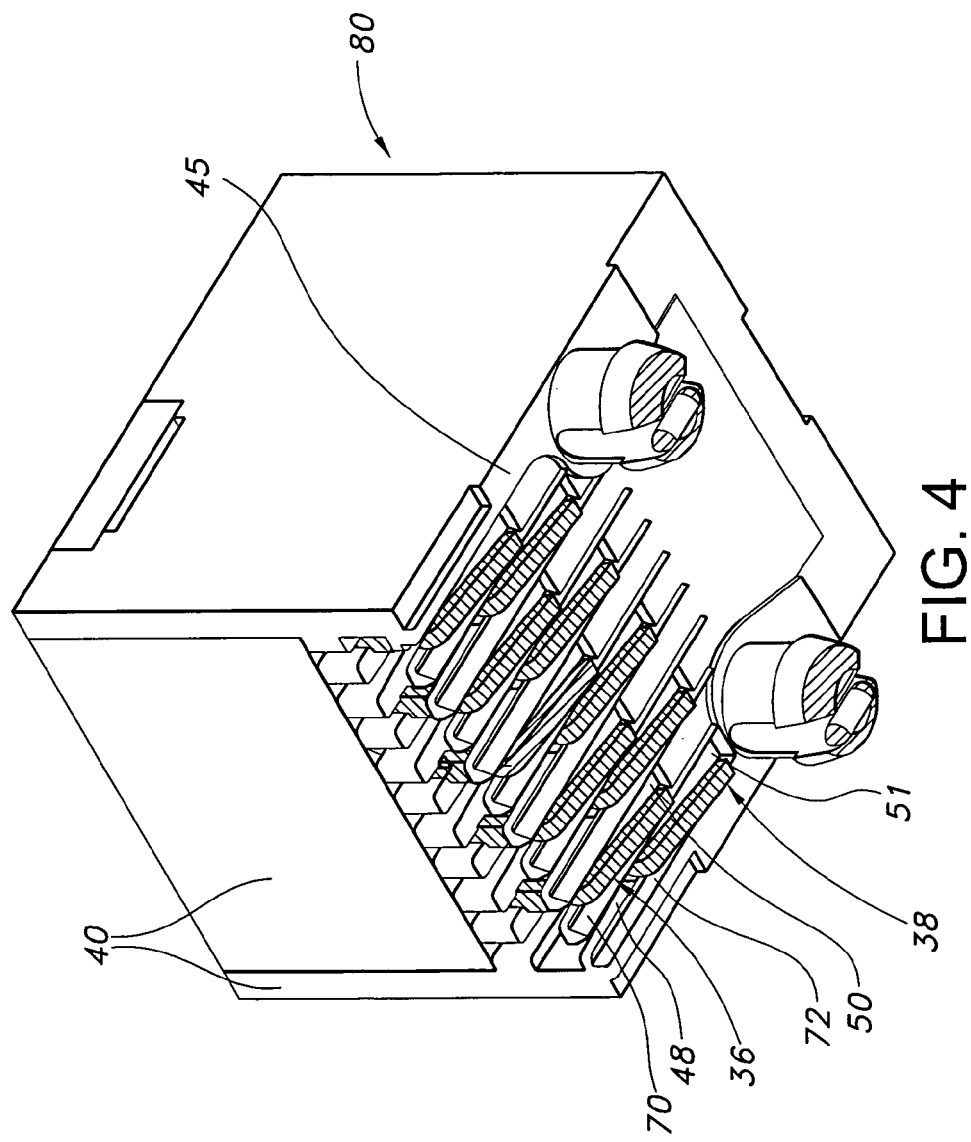
FIG. 4 is a perspective view of a modular female jack viewed from under and from the rear of the jack after assembly of the contacts into the jack

Referring now to FIG. 4, which illustrates a preferred embodiment of the present invention in which connector 80 is shown fully loaded with contacts 20 (FIG. 2). As described previously, solder tail portion has a reverse "L" shape in which the vertical leg 34 (FIG. 2) of the L joins to foot portion 38. As may be seen, foot 38 in its at rest position is angled downward from its end joined to vertical leg 34 such that free end 39 is a greater distance from channel 50 than joined end of foot 38. Angled surface 70 of rib 47 provides means for urging solder tail foot 36 into its corresponding channel 50 located between ribs 47 and 49. Angled surface 70, by virtue of its slanted shape, assists in guiding solder tail foot 38 into a deflected position and greatly reduces the likelihood that free end 39 could snag or hang as it moves into its fully deflected position between adjacent ribs 47 and 49. There is a corresponding angled surface in rib 49 in opposing position to angled surface 70, in which both angled surfaces act in unison to guide solder tail foot 38 into its desired orientation between said ribs.

Figure 5:
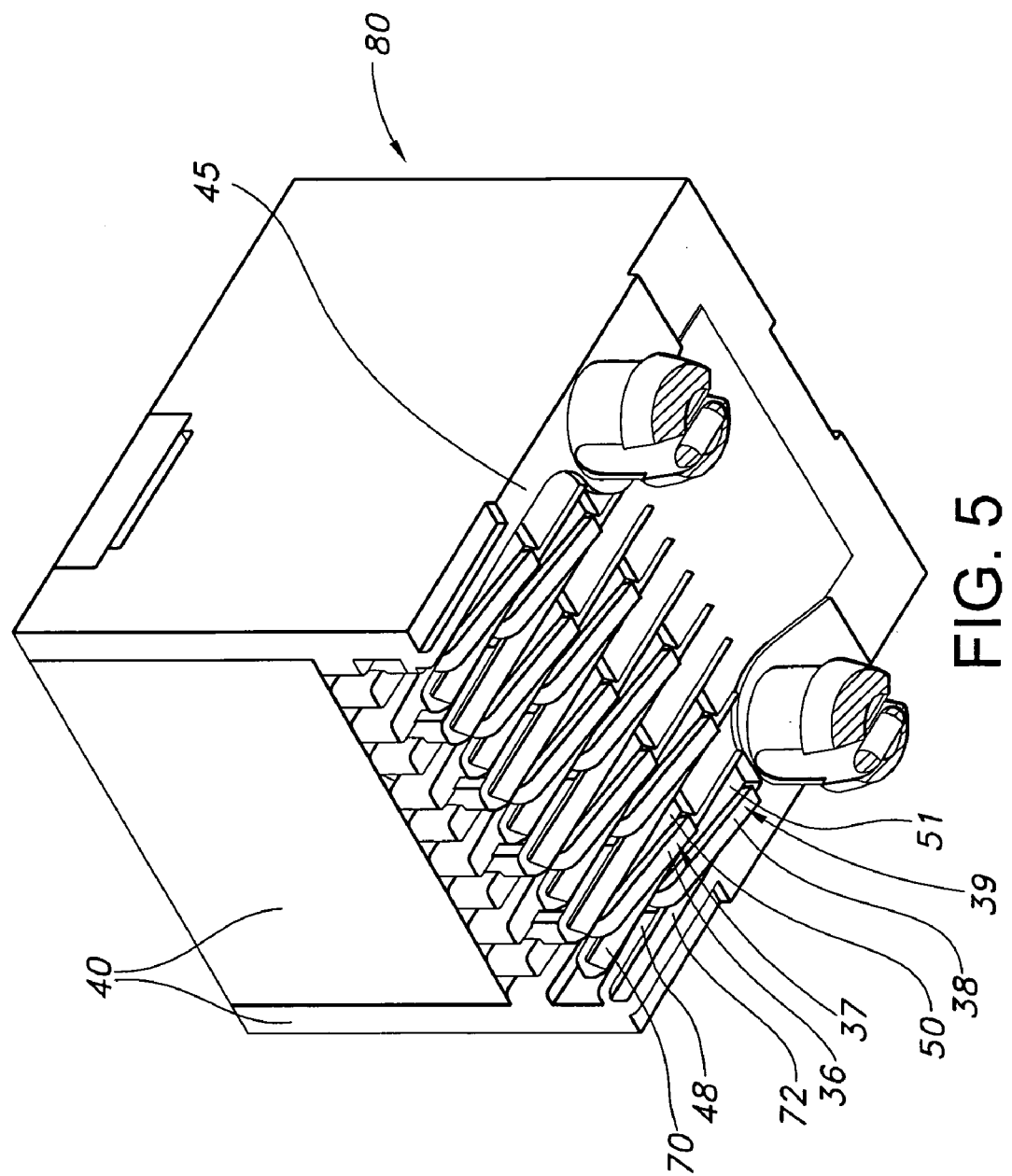
FIG. 5 is another perspective view of a modular female jack viewed from under and from the rear of the jack after assembly of the contacts into the jack

Referring now to FIG. 5, it can be seen that the width of channel 50 is slightly wider than the width of solder tail foot 36 to provide for precision alignment of foot 36 to printed circuit board 10. Due to the inherent spring characteristics of the material used to produce the contact, solder tail foot 36 exerts force to return to its at rest state, and resists deflection during the process of seating connector 80 onto circuit board 10. During this deflection, solder tail foot 36 can move both vertically as well as horizontally, creating the possibility of foot 36 changing its relative position as a result of its deflection. To limit the distance that foot 36 can move relative to mounting means 15, angled surface 70 of V rib 47 centers the deflected foot 36 to a new location which brings said foot to an aligned position comparable to said foot's original, at rest horizontal position relative to said mounting means 15. This aligning feature of said V ribs assures that foot 36 will be precisely positioned to said solder paste pattern to produce a high quality solder filet. The location of foot 36 such that it is fully under the lower wall of connector 80 provides mechanical protection from inadvertent misalignment of said foot 36. As foot 36 does not extend beyond rear wall 40 of connector 80, and is protected by the size and projection of mounting means 15, each solder tail foot is not exposed beyond the protective boundaries of connector 80.

I claim:

1. A modular-style telephone jack for mounting to a printed circuit board comprising:
    a jack housing having a lower wall positionable over said printed circuit board, said lower wall including a plurality of side by side ribs extending therefrom and a plurality of channels between said ribs and recessed therefrom;
    a plurality of electrical contacts supported in said jack housing having elongate solder tail feet resident between said ribs and exteriorly accessible through said channels for engagement with traces of said printed circuit board, said ribs extending along said lower wall at least along the length of said solder tail feet.

2. A jack of claim 1 wherein ribs having a V-shaped cross section.

3. A jack of claim 1 wherein said channels have a width substantially equal to the width of said feet of said solder tails.

4. A jack of claim 2 wherein each of said V-shaped ribs defines a peak and wherein said peaks of said ribs are engageable with said printed circuit board.

5. A jack of claim 1 wherein said solder tail feet are spring biased so as to deflect into said channels upon mounting to said printed circuit board.

6. A jack of claim 1 wherein said solder tail feet are engagable with said traces on said printed circuit board along an extent thereof.

7. A jack of claim 6 wherein solder tail feet are resilient.

\* \* \* \* \*